United States Patent [19]

Imai et al.

[11] Patent Number: 5,759,638

[45] Date of Patent: Jun. 2, 1998

[54] PROCESS FOR FORMING ELECTRONIC CIRCUIT

[75] Inventors: Takafumi Imai, Nitta-gun; Keiji Kabeta, Kitagunma-gun; Kiyoaki Syuto, Ota; Shigeru Wakamatsu, Kumagaya, all of Japan

[73] Assignee: Toshiba Silicone Co., Ltd., Tokyo, Japan

[21] Appl. No.: 793,784

[22] PCT Filed: Apr. 18, 1995

[86] PCT No.: PCT/JP95/00752

§ 371 Date: Mar. 4, 1997

§ 102(e) Date: Mar. 4, 1997

[87] PCT Pub. No.: WO96/08127

PCT Pub. Date: Mar. 14, 1996

[30] Foreign Application Priority Data

Sep. 6, 1994 [JP] Japan ..................... 6-212753

[51] Int. Cl.$^6$ ..................... H05H 1/00
[52] U.S. Cl. ..................... 427/539; 427/126.1; 427/282; 427/333; 427/337; 427/384; 427/402
[58] Field of Search ..................... 427/539, 535, 427/579, 126.1, 282, 333, 337, 384, 402

[56] References Cited

U.S. PATENT DOCUMENTS

| 3,663,224 | 5/1972 | Hallman et al. | 430/314 |
| 4,921,321 | 5/1990 | Weidman | 385/130 |

FOREIGN PATENT DOCUMENTS 7-48515  2/1995  Japan.

*Primary Examiner*—Bernard Pianalto
*Attorney, Agent, or Firm*—Jordan and Hamburg

[57] ABSTRACT

The present invention relates to a process for forming an electronic circuit, which comprises coating a polyorganosilane on at least one surface of a substrate for forming an electronic circuit, followed by drying to form a solid state polysilane thin film, masking a portion for forming a circuit of said thin film and oxidizing a remaining portion to form an insulating portion, and then doping an oxidizing substance to the portion subjected to masking to form a conductive portion, and in order to oxidize a partial portion of the thin film, said thin film is irradiated with UV light in the presence of oxygen, preferably, in the oxidizing step, by carrying out partial oxidation while controlling an oxidation degree, the remaining portion is converted into three or more kinds of portions having different volume resistivities.

13 Claims, No Drawings

5,759,638

1

PROCESS FOR FORMING ELECTRONIC CIRCUIT

TECHNICAL FIELD

This invention relates to a process for forming an electronic circuit, more specifically to a process for forming an electronic circuit by forming a thin layer on the surface of a base material by using a polyorganosilane, particularly a network skeleton polyorganosilane, oxidizing a partial portion thereof and then carrying out doping.

BACKGROUND ART

In order to form an electronic circuit, various methods have been carried out depending on the use thereof. They are methods in which conductor portions are formed by using a substance having conductivity or semiconductivity and the conductor portions are separated by an insulating substance. As a method for forming the conductor portions, there has conventionally been carried out a method of mechanically processing a metal, such as stretching, machining, pressing, cutting, etc. Also, there has generally been carried out a method in which a metal film or semiconductor film is formed and a part of the film is melted away by a chemical reaction to form a conductor portion. The latter chemical method has widely been used particularly in the fields of electronics and microelectronics where fine processing is required. The conductor portions formed by these methods are further processed by using an insulating substance to form an electronic circuit.

In all of these chemical processing methods, a conductor portion is formed by removing a conductor material partially. However, in these methods, not only a waste of the material is generated, but also there is a problem that processing steps are numerous. The fact that the processing steps are numerous means that possibilities of lowering pattern precision and contaminating the material by the processing are large. The latter problem has been more serious as an integration degree, required processing precision and circuit characteristics are increased in fine processing by the chemical method. Also, in this fine processing by the chemical method, a problem of disposing discharged matter discharged in the processing steps has been also serious.

Further, an actual electronic circuit comprises not only a conductive portion and an insulating portion but also a resistor, a condenser, etc. mounted thereon. It is preferred to remove the steps of mounting them, if possible.

Among organosilicon type polymers, a polyorganosilane or an analogue thereof is a polymer having a Si—Si bond skeletal structure comprising a σ bond, its a electrons can be delocalized, and as a result, it has unique electronic characteristics such as (semi)conductivity, photoconductivity, luminous characteristics, etc. which are different from those of a carbon type polymer. Also, reactions of polysilanes have heretofore been studied, and particularly a photolysis reaction has been investigated in detail. It has been reported that cleavage of a Si—Si bond occurs by irradiating polyorganosilane with UV ray, and by carrying out this irradiation with UV ray in the air, photooxidation occurs to convert polyorganosilane into a polyorganosiloxane, etc. (for example: J. M. Ziegler et al., Proc. SPIE, Vol. 539, p. 166 (1985); H. Ban et al., J. Appl. Polym. Sci., Vol. 33, p.2787 (1987)).

Weidman has disclosed in Japanese Provisional Patent Publication No. 302439/1990 that by spin coating a polysilyne synthesized from an alkyl or aryl trichlorosilane and photooxidizing the polysilyne by irradiation with UV ray in the presence of oxygen, a portion having a low refractive index is generated and an optical device and an electronic device such as a passive waveguide are manufactured by using this.

Yokoyama et al. have disclosed in Chemistry Letters, 1989, p. 1,005 and Polymer Society of Japan, Polymer Preprints Japan, Vol. 41, p. 4,012 that a siloxane pattern is formed by photooxidation of a poly(diorganosilane) film and can be applied to image recording and xerography due to disappearance of a hole-transporting ability.

However, in either of the above disclosures, there has not been disclosed formation of an electronic circuit by utilizing change in electroconductivity by photooxidation of a polyorganosilane or formation of an electronic circuit in which volume resistivity is controlled by using a photooxidation reaction in which the oxidation degree of a polyorganosilane is controlled.

An object of the present invention is to provide a novel process for forming an electronic circuit, in which a waste of a material, and lowering of pattern precision and contamination of a material accompanied with increase in processing steps in a conventional process for forming an electronic circuit are prevented and further portions having different volume resistivities can be formed.

The present inventors have paid attention to the facts that an Si—Si bond of a polyorganosilane is converted into an Si—O—Si bond by a photooxidation reaction, and a polymer having such an Si—O—Si bond has properties which are quite different from those of said polyorganosilane and does not exhibit (semi)conductivity of the above-mentioned polyorganosilane, but exhibits insulating property, and found that by utilizing an oxidation reaction of a polyorgano- silane, formation of an electronic circuit by change in electroconductivity (dark conductivity) or volume resistivity is rendered possible, to accomplish the present invention. In the present invention, a conductor and conductivity as an attribute thereof are used as concepts including a semiconductor and semiconductivity.

DISCLOSURE OF THE INVENTION

That is, the process for forming an electronic circuit of the present invention comprises coating a polyorganosilane on at least one surface of a substrate for forming an electronic circuit, followed by drying to form a solid state polysilane thin film, masking a portion for forming a circuit of said thin film and oxidizing a remaining portion to form an insulating portion, and then doping an oxidizing substance to the portion subjected to masking to form a conductive portion.

According to a preferred embodiment of the present invention, in the above formation process, by carrying out partial oxidation while controlling the oxidation degree of the solid state polysilane thin film and then carrying out doping with an oxidizing substance, the remaining portion is converted into three or more kinds of portions having different volume resistivities.

BEST MODE FOR PRACTICING THE INVENTION

In the present specification, "partial oxidation" means oxidation of a portion which is 20% or more and less than 100% of the whole surface area of the substrate for forming an electronic circuit, and "controlling of an oxidation degree" means controlling of an area value of UV (UV ray) absorption in a region of 250 to 400 nm which is inherent in a solid state polysilane, between 100 to 0% by oxidation when an initial area value of UV absorption in the above region is defined as 100% and an area value of UV absorption in the region when oxidation does not proceed any longer is defined as 0%.

The polyorganosilane to be used in the present invention has a molecular skeleton comprising an Si—Si bond. The skeletal structure thereof is not particularly limited and may be either chain, branched or network, but from the points that said polyorganosilane is solid, a solid state is retained even when at least partial Si—Si bonds in a molecule are converted into siloxanes by the oxidation reaction and also lowering of the molecular weight which proceeds accompanied with the oxidation reaction is prevented, it is preferred that the polyorganosilane and also a polysilane chain itself or crosslinking by a divalent organic group $R^2$ described below have a network skeleton.

Monovalent organic groups $R^1$s are bonded to the silicon atoms of the polyorganosilane. Also, a divalent aromatic hydrocarbon group or heterocyclic group $R^2$ may exist bonding to two silicone atoms in a molecule.

As the monovalent organic group $R^1$ bonded to the silicon atom, a substituted or unsubstituted monovalent hydrocarbon group and a monovalent heterocyclic group are used. That is, such $R^1$ may be exemplified by an alkyl group having 1 to 12 carbon atoms such as methyl, ethyl, propyl, butyl, pentyl, hexyl, octyl, decyl, etc.; a cycloalkyl group having 3 to 7 carbon atoms such as cyclohexyl, etc.; an aralkyl group having 7 to 12 carbon atoms such as 2-phenylethyl, 2-phenylpropyl, etc.; an alkenyl group having 2 to 6 carbon atoms such as vinyl, allyl, etc.; an aryl group such as phenyl, etc.; an alkaryl group such as tolyl, etc.; an alkenylaryl group substituted by an alkenyl group having 2 to 6 carbon atoms, such as vinylphenyl, etc.; a monovalent substituted hydrocarbon group such as 4-(diethylamino)-phenyl, etc.; a monovalent heterocyclic group such as thienyl, pyrrolyl, etc.; and a heterocyclic ring-substituted alkyl group in which an alkyl group having 1 to 6 carbon atoms is substituted by a heterocyclic group, such as 3-imidazolylpropyl, 3-carbazolylpropyl, etc. In addition thereto, substituted or unsubstituted alkoxy groups which are introduced in the course of a synthetic reaction may exist bonding to a part of the silicon atoms, although they are not essential for the polyorganosilane to be used in the present invention. Such a substituted or unsubstituted alkoxy group may be exemplified by an alkoxy group having 1 to 6 carbon atoms such as methoxy, ethoxy, propoxy, butoxy, etc.; and a substituted alkoxy group having 3 to 12 carbon atoms such as 2-methoxyethoxy, 2-ethoxyethoxy, 2-butoxyethoxy, etc.

As $R^1$, from availability of a starting material and easiness of synthesis of the polyorganosilane, an alkyl group having 1 to 6 carbon atoms, a cyclohexyl group and a phenyl group are preferred. Also, as the above-mentioned substituted or unsubstituted alkoxy group which is introduced in the course of synthesis, from easiness of synthesis of the polyorganosilane, an alkoxy group having 1 to 4 carbon atoms is preferred. On the other hand, in order to impart high electronic conductive characteristic to the solid state polysilane thin film, it is preferred that a part of these groups are heterocyclic ring-containing groups such as thienyl, pyrrolyl, 3-imidazolylpropyl, 3-carbazolylpropyl, etc.

In the above-mentioned network skeletal structure, the degree of network is not particularly limited, but a numerical value: $R^1/Si$ showing the degree of network by a polysilane bond is preferably in the range of 1.00 to 1.97, more preferably 1.00 to 1.91, further preferably 1.00 to 1.75. If the degree of network is small and $R^1/Si$ exceeds 1.97, at the time of the oxidation reaction, not only an oxidation reaction forming a siloxane bond but also lowering of the molecular weight occur, whereby it may be difficult to maintain the solid state polysilane thin film as a solid film.

As the network skeleton, a divalent organic group $R^2$ bonded to two silicon atoms may be contained in a molecule, which is convenient in the points of heightening the electroconductivity of the polyorganosilane having a network structure, also imparting solubility to an organic solvent thereto and facilitating formation of a thin film of said polyorganosilane. In order that an electronic circuit to be formed has good electronic conductive characteristic, R2 should be an aromatic hydrocarbon group or a heterocyclic group. Such $R^2$ may be exemplified by an aromatic hydrocarbon group such as phenylene, biphenylene, etc.; and a heterocyclic group such as thienylene, pyrrolylene, etc. In this case, the amount of $R^2$s is preferably 30% or less, more preferably 1 to 20% of the total amount of organic groups bonded to the silicon atoms, i.e., $R^1$s and $R^2$s.

The total amount of the heterocyclic ring-containing groups in $R^1$s and $R^2$s is preferably 1 to 30%, more preferably 5 to 15% based on all organic groups $R^1$s and $R^2$s bonded to the silicon atoms. If the ratio of the heterocyclic ring-containing groups is small, high electronic conductive characteristic cannot be obtained. On the other hand, if the ratio is too much, the insulating property of an oxidized portion is lowered, and as a result, formation of an electronic circuit becomes difficult.

The weight average molecular weight of the polyorganosilane is not particularly limited so long as said polyorganosilane is soluble in a solvent and a solid film can be formed, but from the points of easiness of synthesis, solubility in a solvent and characteristics of an electronic circuit, etc., it is preferably 1,000 to 1,000,000, more preferably in the range of 1,500 to 200,000.

The polyorganosilane, particularly the network skeleton polyorganosilane to be used in the present invention can be prepared by using a known method for synthesizing a polyorganosilane. By using a condensation reaction (the Kipping method or the Wurtz method) of an organochlorosilane using metallic sodium and controlling the mixing ratio of an organochlorosilane which is a starting material, various network skeleton polyorganosilane in which the degree of molecular skeleton network is controlled can be obtained. Also, when the disproportionation polymerization method of alkoxydisilanes disclosed in Japanese Provisional Patent Publication No. 57002/1994 is used, network skeleton polyorganosilane into which various substituents are introduced can be synthesized under mild conditions.

Further, the polyorganosilane having $R^2$ in the molecule can be synthesized by, for example, reacting an alkoxy group-containing disilane compound with an organoalkali metal compound represented by a formula $MR^2M$ (wherein $R^2$ is as described above, and M represents an alkali metal atom) to synthesize an alkoxy group-containing bis(disilyl) compound in which the $R^2$ group exists between two silicon atoms, and subjecting said disilyl compound and the above and/or other alkoxy group-containing disilane compound(s) to a disproportionation reaction using an alkali metal alkoxide by-produced in the above reaction, as a catalyst.

A process for forming a thin film by using the polyorganosilane as described above is generally a process in which the polyorganosilane is dissolved in a suitable solvent, then this solution is coated on a substrate and the solvent is evaporated to obtain a solid state polysilane thin film. The solvent may be exemplified by an aromatic hydrocarbon solvent such as toluene and xylene; and an aprotic polar solvent such as tetrahydrofuran, etc. A coating method may be exemplified by dipping, spin coating, etc., but spin coating is preferred from the point that a thin film having a uniform thickness is obtained.

Of the solid state polysilane thin film thus obtained, a specific portion to which electric insulating property is to be imparted is oxidized preferably while controlling an oxidation degree, and then doping with an oxidizing substance is carried out to form an electronic circuit. The oxidized polysiloxane portion functions as an insulating portion, and the portion where shielded from light and doped functions as a conductive portion. As the oxidation method, any method may be used so long as it is a method in which a specific portion of a thin film can be designated and oxidized, but from simplicity and easiness of oxidation reaction operation and the point that a portion to be oxidized can be designated to have a fine pattern state, it is preferred to use photooxidation by irradiation with light, particularly, UV ray in the presence of oxygen.

Photooxidation of the solid state polysilane thin film is carried out by, for example, irradiating a specific portion to which electric insulating property is to be imparted of said thin film with a necessary dose of UV ray having a wavelength of 254 nm or 365 nm or a broad wavelength region with 254 nm or 365 nm being a center in the air by using a light source such as a low pressure or high pressure mercury lamp. The amount of oxygen at the time of oxidation is preferably a concentration which exceeds 0% by volume and is 50% by volume or less, and it is preferred that the temperature is $-200°$ to $200°$ C. and the irradiation dose of UV ray is 0 to 20 J/cm$^2$. The irradiation time varies depending on UV ray strength so that it cannot be determined indiscriminately, but it is preferably about 0.01 second to 1 hour.

By the photooxidation as described above, a part or all of Si—Si bonds of the solid state polysilane at the exposed portion are converted into Si—O—Si bonds. In this case, merely by changing a part of Si—Si bonds to Si—O—Si bonds, i.e., without converting the exposed portion into a polysiloxane completely, the electroconductivity of the thin film can be lowered to have electric insulating property, and the electronic circuit according to the present invention can be formed.

In a preferred embodiment of the present invention, as the photooxidation reaction in which the oxidation degree of the solid state polysilane thin film is controlled, there may be mentioned, for example, two methods shown below. These methods may be used singly or in combination.

The first method is a method of controlling the exposure dose of exposed UV ray, and the oxidation degree is controlled thereby. This method is carried out by, for example, carrying out irradiation with UV ray having a wavelength of 254 nm or 365 nm or a wavelength region with 254 nm or 365 nm being a center in a dose adjusted so that the volume resistivity of said thin film becomes a volume resistivity required for a portion to be converted, in the air by using a light source such as a low pressure or high pressure mercury lamp. At the time of irradiation, when the exposure dose is changed depending on portions, portions having different volume resistivities are formed thereby.

The second method is a method of selecting the exposure wavelength of exposed UV ray, and the oxidation degree is also controlled by this method. This method is carried out by, for example, in the air, carrying out irradiation with UV ray having a wavelength of 172, 222 or 308 nm so that the volume resistivity of said thin film becomes a volume resistivity required for a portion to be converted. At the time of irradiation, when the exposure wavelength is changed depending on portions, portions having different volume resistivities are formed accompanied therewith. Also, in this case, by carrying out controlling of the exposure dose, volume resistivity is controlled more precisely.

By employing the above method, three or more kinds of portions having different volume resistivity values from each other can be formed. By forming three or more kinds of portions having different volume resistivity values as described above, for example, an electronic circuit having a resistor can be obtained. Further, an electronic circuit having resistors having several kinds of resistance values can be obtained by forming portions in which the oxidation degree is changed. It is considered that when only two kinds of portions having different volume resistivities are formed, an electric current passes only through a portion having a small resistance value, and a portion having a large resistance value does not function as a resistor in a circuit, but functions as a mere non-conductor portion (an insulating portion). Therefore, by forming three or more kinds of portions having different volume resistivity values from each other, formation of an electronic circuit having a resistor can be carried out. The value of a volume resistivity is relative, and when this value of a portion is lower than that of the other portion, the portion becomes conductive, while if it is higher, the portion becomes insulative.

The oxidizing substance to be used for doping may be exemplified by antimony pentafluoride, iodine, ferric chloride, etc., but from the points that charge-generating efficiency is good and lowering of the molecular weight of the polyorganosilane is difficultly caused, iodine and ferric chloride are preferred. Doping using these substances can be achieved by exposing or dipping the above-mentioned polyorganosilane thin film in which a specific portion is oxidized, in vapor or a solution of these oxidizing substances. The amount of the oxidizing substance at the time of doping is optional, the temperature is preferably $-78°$ C. to $200°$ C., more preferably $0°$ C. to $180°$ C., and the doping time is preferably 10 seconds to 36 hours, more preferably 10 seconds to 25 hours. By doping, the oxidized portion of the polyorganosilane is not changed, and a masked portion becomes conductive. It is said that when doping is carried out by using iodine as the oxidizing substance, 0.5 to 5.0 of $I_2$ are introduced into a Si—Si bond, although it is not definite.

Utilizability in Industry

According to the present invention, an electronic circuit can be formed basically by the steps of three stages of forming a solid state polysilane thin film on a substrate by using a polyorganosilane having a specific structure, oxidizing a partial portion thereof by exposure while controlling an oxidation degree and further carrying out doping with an oxidizing substance. The electronic circuit thus obtained can be used as an electronic conductive circuit. Further, a resistor having a desired resistance value can be formed in the circuit only by controlling an oxidation degree. That is, not only it can be used as a passive circuit such as an conductive circuit for electronics or microelectronics, etc., but also it can be used as an active electronic circuit when a luminous function or the like is imparted thereto.

In the process for forming an electronic circuit according to the present invention, a pattern is formed by converting a specific portion of a conductor into an insulator to form a boundary of electronic conductive characteristics, whereby a waste of a material is generated.

In addition, processing steps until formation of an electronic circuit is less than those of a conventional process for forming an electronic circuit, comprising formation of a conductor, coating of a resist, exposure, etching and peeling and removing of the remaining resist, and there are less possibilities of lowering pattern precision and contaminating a material by processing. Thus, the process of the present invention is an extremely excellent process for forming an electronic circuit.

EXAMPLES

In the following, the present invention is explained in more detail by referring to Synthetic examples, Examples and Comparative examples. In these examples, part represents part by weight, and physical property values represent values at 25° C. Examples shown below are mere exemplification, and the present invention is not limited by these Examples.

Synthetic Example 1 (synthesis of network skeleton polyorganosilane)

Under dry argon gas stream, 50 parts of 1,2-dimethyl-1, 1,2,2-tetraethoxydisilane was charged into a flask equipped with a reflux condenser and a stirrer, 10 mole % of sodium ethoxide was added thereto, and the mixture was stirred under heating at 100° C. for 20 hours. After cooling, solid components were removed by suction filtration, and the filtrate was slowly poured into 1,000 parts of anhydrous methanol to reprecipitate white solid. The solid collected by separation by means of suction filtration was washed with anhydrous ethanol and dried under reduced pressure to obtain 5 parts of a network structure polyorganosilane. As a result of measuring $^1$H NMR of the obtained polyorganosilane, existences of methyl groups and ethoxy groups were confirmed, and a ratio thereof was 10:1. The weight average molecular weight calculated based on polystyrene standards by GPC was 3,300.

Synthetic Example 2 (synthesis of network skeleton polyorganosilane)

By the same operations as in Synthetic example 1, from 50 parts of 1,2-dimethyl-1,1,2,2-tetraethoxydisilane and 45 parts of phenyltriethoxysilane, 18 parts of a solid network structure polyorganosilane containing methyl groups, phenyl groups and ethoxy groups at 3:1:2 and having a weight average molecular weight calculated based on polystyrene standards by GPC of 2,400 was obtained.

Synthetic Example 3 (synthesis of thienylene group-containing network skeleton polyorganosilane)

By the same operations as in Synthetic example 1, from 50 parts of 1,2-dimethyl-1,1,2,2-tetraethoxydisilane and 20 parts of 2,5-bis(triethoxysilyl)thiophene, 5 parts of a solid network structure polyorganosilane containing methyl groups, thienylene groups and ethoxy groups at 66:6:28 and having a weight average molecular weight calculated based on polystyrene standards by GPC of 16,900 was obtained.

Synthetic Example 4 (synthesis of biphenylene group-containing network skeleton polyorganosilane)

By the same operations as in Synthetic example 1 except for using 10 mole % of 4,4'-dilithiobiphenyl in place of sodium ethoxide and subjecting 50 parts of 1,2-dimethyl-1, 1,2,2-tetraethoxydisilane to disproportionation polymerization, 6 parts of a solid network structure polyorganosilane containing methyl groups, biphenylene groups and ethoxy groups at 80:6:14 and having a weight average molecular weight calculated based on polystyrene standards by GPC of 10,600 was obtained.

Synthetic Example 5 (synthesis of network skeleton polyorganosilane)

Under a nitrogen atmosphere, 400 parts of dry toluene and 14 parts of metallic sodium were charged into a flask equipped with a reflux condenser and a stirrer, heated until a reflux state was obtained and vigorously stirred to prepare a sodium dispersion. Then, a mixture of 21 parts of phenyltrichlorosilane and 20 parts of methylcyclohexyldichlorosilane was slowly added dropwise to said dispersion. A reaction was carried out for 8 hours under reflux by heating. The resulting reaction mixture was added to 100 parts of methanol, and after the mixture was stirred at room temperature for 1 hour, the reaction mixture was filtered, followed by concentration. This concentrate was dissolved in 20 parts of toluene, and the solution was poured into 1,000 parts of methanol to reprecipitate. The solid material was separated by filtration, washed with other methanol and dried to obtain 6 parts by a powdery network skeleton polyorganosilane. As a result of $^1$H NMR of the product, the ratio of phenyl groups to cyclohexyl groups was 1:1. The weight average molecular weight calculated based on polystyrene standards by GPC was 2,000.

Synthetic Example 6 (synthesis of network skeleton polyorganosilane)

By the same operations as in Synthetic example 5, from 30 parts of methylcyclohexyldichlorosilane, 11 parts of phenyltrichlorosilane and 12 parts of metallic sodium, a solid network skeleton polyorganosilane having a ratio of phenyl groups to cyclohexyl groups of 0.9:3 and a weight average molecular weight calculated based on polystyrene standards of 1,200 was obtained.

Synthetic Example 7 (synthesis of chain skeleton polyorganosilane)

By the same operations as in Synthetic example 5, from 38 parts of methylphenyldichlorosilane and 10 parts of metallic sodium, a solid poly(methylphenylsilane) having a weight average molecular weight calculated based on polystyrene standards of 7,900 was obtained.

Example 1

After 5 parts of the polyorganosilane obtained in Synthetic example 1 was dissolved in 100 parts of chloroform and this solution was spin coated on quartz glass, the solvent was evaporated at room temperature, and then the residue was maintained at 100° C. for 1 hour under reduced pressure to form a polyorganosilane film having a thickness of 0.7 μm on the surface of the quartz glass. A partial portion of this quartz glass plate coated with the polyorganosilane film was shielded from light with an aluminum foil, and the plate was irradiated with 9,600 mJ (calculated on a wavelength of 350 nm) of UV ray in the air by using a 80 W high pressure mercury lamp. Then, this quartz glass plate was exposed to iodine vapor for 24 hours to obtain a test sample. When the volume resistivity of this sample was measured, the shielded portion exhibited a volume resistivity of $3 \times 10^6$ Ω·cm, but the exposed portion exhibited a volume resistivity of $10^{13}$ Ω·cm or more. Thus, it has been clarified that a semiconductive circuit can be formed. When the UV spectrum of the quartz glass plate coated with the polyorganosilane film, which was partially shielded from light and irradiated with UV ray as described above was measured, in the shielded portion, there was no change in spectrum as compared with that before irradiation with light, but in the exposed portion, the absorption spectrum by the polyorganosilane at 250 to 400 nm disappeared.

Example 2

In the same manner as in Example 1, from the polyorganosilane obtained in Synthetic example 2, a polyorganosilane film having a thickness of 0.5 μm was formed. In the same manner as in Example 1, a partial portion was shielded from light, irradiated with 9,600 mJ (calculated on a wavelength of 350 nm) of UV ray in the air and then exposed to iodine vapor for 48 hours. When the volume resistivity of a resulting sample was measured, the shielded portion exhibited a volume resistivity of $6 \times 10^6$ Ω·cm, but the exposed portion exhibited a volume resistivity of $10^{13}$ Ω·cm or more.

Example 3

In the same manner as in Example 1, from the polyorganosilane obtained in Synthetic example 3, a polyorganosilane film having a thickness of 0.6 μm was formed. In the same manner as in Example 1, a partial portion was shielded from light, irradiated with 6,000 mJ (calculated on a wavelength of 350 nm) of UV ray in the air and then exposed to iodine vapor for 24 hours. When the volume resistivity of a resulting sample was measured, the shielded portion exhibited a volume resistivity of $2 \times 10^4$ Ω·cm, but the exposed portion exhibited a volume resistivity of $10^{13}$ Ω·cm or more.

Example 4

In the same manner as in Example 1, from the polyorganosilane obtained in Synthetic example 4, a polyorganosilane film having a thickness of 0.3 μm was formed. In the same manner as in Example 1, a partial portion was shielded from light, irradiated with 9,600 mJ (calculated on a wavelength of 350 nm) of UV ray in the air and then exposed to iodine vapor for 24 hours. When the volume resistivity of a resulting sample was measured, the shielded portion exhibited a volume resistivity of $3 \times 10^4$ Ω·cm, but the exposed portion exhibited a volume resistivity of $10^{13}$ Ω·cm or more.

Example 5

In the same manner as in Example 1, from the polyorganosilane obtained in Synthetic example 5, a polyorganosilane film having a thickness of 0.9 μm was formed. In the same manner as in Example 1, a partial portion was shielded from light, irradiated with 9,600 mJ (calculated on a wavelength of 350 nm) of UV ray in the air and then exposed to iodine vapor for 24 hours. When the volume resistivity of a resulting sample was measured, the shielded portion exhibited a volume resistivity of $8 \times 10^5$ Ω·cm, but the exposed portion exhibited a volume resistivity of $10^{13}$ Ω·cm or more.

Example 6

In the same manner as in Example 1, from the polyorganosilane obtained in Synthetic example 6, a polyorganosilane film having a thickness of 0.6 μm was formed. In the same manner as in Example 1, a partial portion was shielded from light, irradiated with 9,600 mJ (calculated on a wavelength of 350 nm) of UV ray in the air and then exposed to iodine vapor for 24 hours. When the volume resistivity of a resulting sample was measured, the shielded portion exhibited a volume resistivity of $2 \times 10^5$ Ω·cm, but the exposed portion exhibited a volume resistivity of $10^{13}$ Ω·cm or more.

Example 7

In the same manner as in Example 1, from the polyorganosilane obtained in Synthetic example 7, a polyorganosilane film having a thickness of 0.7 μm was formed. In the same manner as in Example 1, a partial portion was shielded from light, irradiated with 9,600 mJ (calculated on a wavelength of 350 nm) of UV ray in the air and then exposed to iodine vapor for 24 hours. When the volume resistivity of a resulting sample was measured, the shielded portion exhibited a volume resistivity of $3 \times 10^6$ Ω·cm, but the exposed portion exhibited a volume resistivity of $10^{13}$ Ω·cm or more.

Example 8

After 5 parts of the polyorganosilane obtained in Synthetic example 1 was dissolved in 100 parts of chloroform and this solution was spin coated on quartz glass, the solvent was transpirated at room temperature, and then the residue was maintained at 100° C. for 1 hour under reduced pressure to form a polyorganosilane film having a thickness of 0.7 μm on the surface of the quartz glass. A partial portion of this quartz glass plate coated with the polyorganosilane film was shielded from light with an aluminum foil, and a part of the plate and other part of the plate were irradiated with 1,200 mJ/cm² and 9,600 mJ/cm² (calculated on a wavelength of 350 nm) of UV ray, respectively, in the air by using a 80 W high pressure mercury lamp. Then, this quartz glass plate was exposed to iodine vapor for 1 hour to obtain a test sample. The volume resistivity of this sample was measured by using the two probe method. The results are shown in Table 1. As can be clearly seen from the results, it has been confirmed that by controlling an exposure amount, portions having different volume resistivities can be formed.

TABLE 1

| Exposure dose (mJ/cm²) | 0 | 1,200 | 9,600 |
|---|---|---|---|
| Volume resistivity (Ω · cm) | $4.5 \times 10^6$ | $9.2 \times 10^8$ | $>10^{12}$ |

Examples 9 and 10

In the same manner as in Example 1, from the polyorganosilane synthesized in Synthetic examples 3 and 5, thin films were obtained, respectively. After exposure in a suitable amount, doping with iodine was carried out, and volume resistivities were measured. The results are shown in Table 2.

TABLE 2

| | Film thickness | Exposure dose (mJ/cm²), volume resistivity (Ω · cm) | | |
|---|---|---|---|---|
| Example | (μm) | 0 | 3000 | 9600 |
| 9 | 0.6 | $6.5 \times 10^3$ | $5.7 \times 10^7$ | $>10^{12}$ |
| 10 | 0.7 | $6.0 \times 10^6$ | $3.7 \times 10^9$ | $>10^{12}$ |

Example 11

In the same manner as in Example 1, from the polyorganosilane synthesized in Synthetic example 1, a polyorganosilane film having a thickness of 0.7 μm was obtained. While this film was partially shielded from light by using an aluminum foil, it was exposed with light having a wavelength of 172, 222 or 308 nm by using a dielectric barrier discharge eximex lamp (manufactured by Ushio Denki Kabushiki Kaisha). The exposure was carried out so that the polyorganosilane film was placed at a distance of 1 mm from the surface of the lamp, and the exposure amount was adjusted to be 1000 mJ/cm² by lamp radiation intensity and the exposure time. Thereafter, doping with iodine was carried out for 1 hour, and the volume resistivities of the respective portions were measured. The results are shown in Table 3. From these results, it has been clarified that volume resistivity can be controlled by selecting exposure wavelength.

TABLE 3

| Exposure wavelength (nm) | Radiation intensity (mW/cm$^2$) | Exposure time (sec) | Volume resistivity ($\Omega \cdot$ cm) |
| --- | --- | --- | --- |
| 172 | 10 | 100 | $1.2 \times 10^{10}$ |
| 222 | 7 | 143 | $5.6 \times 10^{8}$ |
| 308 | 10 | 100 | $9.8 \times 10^{6}$ |

We claim:

1. A process for forming an electronic circuit, which comprises coating a polyorganosilane on at least one surface of a substrate for forming an electronic circuit, followed by drying to form a solid state polysilane thin film, masking a portion for forming a circuit of said thin film and oxidizing a remaining portion to form an insulating portion, and then doping an oxidizing substance to the portion subjected to masking to form a conductive portion.

2. The process for forming an electronic circuit according to claim 1, wherein in order to oxidize a partial portion of the thin film, said thin film is irradiated with UV light in the presence of oxygen.

3. The process for forming an electronic circuit according to claim 2, wherein in the oxidizing step, by carrying out partial oxidation while controlling an oxidation degree, the remaining portion is converted into three or more kinds of portions having different volume resistivities.

4. The process for forming an electronic circuit according to claim 3, wherein controlling of the oxidation degree is controlling of volume resistivity by changing the exposure dose of UV ray.

5. The process for forming an electronic circuit according to claim 3, wherein controlling of the oxidation degree is controlling of volume resistivity by changing the exposure wavelength of UV ray.

6. The process for forming an electronic circuit according to claim 1, wherein the oxidizing substance is iodine, ferric chloride or antimony pentafluoride.

7. The process for forming an electronic circuit according to claim 1, wherein the solid state polysilane has a network skeleton.

8. The process for forming an electronic circuit according to claim 1, wherein monovalent organic groups ($R^1$s) bonded to the silicon atoms of the solid state polysilane are the same or different and substituted or unsubstituted monovalent hydrocarbon groups or heterocyclic groups, and a part of them may be substituted or unsubstituted alkoxy groups.

9. The process for forming an electronic circuit according to claim 8, wherein $R^1$s are the same or different alkoxy groups having 1 to 6 carbon atoms, cyclohexyl groups or phenyl groups, and a part of them may be alkoxy groups having 1 to 4 carbon atoms.

10. The process for forming an electronic circuit according to claim 8, wherein 1 to 30% of all organic groups $R^1$s and $R^2$s bonded to the silicon atoms are heterocyclic ring-containing groups.

11. The process for forming an electronic circuit according to claim 8, wherein divalent aromatic hydrocarbon or divalent heterocyclic groups ($R^2$s) in an amount of 30% or less of the total amount of $R^1$s and $R^2$s are bonded to the silicon atoms of the solid state polysilane.

12. The process for forming an electronic circuit according to claim 11, wherein $R^2$ is phenylene, biphenylene, thienylene or pyrrolylene.

13. The process for forming an electronic circuit according to claim 1, wherein the electronic circuit is an electroconductive circuit.

* * * * *